(12) United States Patent
Bernard (10) Patent No.: US 6,392,399 B1
(45) Date of Patent: May 21, 2002

(54) DEVICE FOR MEASUREMENT OF THE ELECTRICAL CONSUMPTION OF A PORTABLE DATA- OR SIGNAL-PROCESSING TERMINAL

(75) Inventor: Robert Bernard, Conflans Sainte Honorine (FR)

(73) Assignee: Sagem SA, Paris (FR)

( * ) Notice: Subject to any disclaimer, the term of this patent is extended or adjusted under 35 U.S.C. 154(b) by 0 days.

(21) Appl. No.: 09/481,029

(22) Filed: Jan. 11, 2000

(30) Foreign Application Priority Data

Jan. 22, 1999 (FR) ............................................. 99 00697

(51) Int. Cl.[7] ............................................. G01R 11/63
(52) U.S. Cl. .................... 324/103 R; 340/636; 327/101
(58) Field of Search ............................. 324/103 R, 426, 324/428, 433, 111, 141; 320/132, 136, 106; 340/636; 327/101, 336; 341/167, 155, 164, 165

(56) References Cited

U.S. PATENT DOCUMENTS

| 3,051,939 A | * | 8/1962 | Gilbert | 341/167 |
| 3,316,547 A | * | 4/1967 | Ammann | 341/167 |
| 3,997,888 A | * | 12/1976 | Kremer | 340/636 |
| 4,109,168 A | * | 8/1978 | Raymond | 327/101 |
| 4,679,000 A | * | 7/1987 | Clark | 324/428 |
| 5,856,757 A | | 1/1999 | Eschauzier | |
| 5,998,971 A | * | 12/1999 | Corbridge | 320/132 |

FOREIGN PATENT DOCUMENTS

EP        0 792 001 A2    8/1997

* cited by examiner

Primary Examiner—Ernest Karlsen
Assistant Examiner—Minh Tang
(74) Attorney, Agent, or Firm—Greenberg Traurig LLP; Eugene C. Rzucidlo (57) ABSTRACT

The device for measurement of current exchanged between a battery (1) and electrical circuits (19) of a portable telephone includes a current sensor (21), connecting the battery (1) to the circuits (19), connected to a first input (22) of first integrating circuits (22–27), integrating the current measurement and controlling a comparator (28, 29, 34) detecting the crossing of a high threshold (Vs+) through the integral of the current and applying to a second input (23) of the first integrating circuits (22–27) a calibrated feedback signal to recall below the high threshold (Vs+), second integrating circuits (12–17) to integrate the feedback signals, providing a measurement of the current exchanged. The invention applies well to mobile telephones.

9 Claims, 6 Drawing Sheets

DEVICE FOR MEASUREMENT OF THE ELECTRICAL CONSUMPTION OF A PORTABLE DATA- OR SIGNAL-PROCESSING TERMINAL

BACKGROUND OF THE INVENTION

A portable data- or signal-processing terminal includes a battery that must be recharged periodically from the power grid, or a cell, that must be changed. Considering, for example, a cellular radio unit, it consumes electrical energy even when it is on stand-by but unused, since it must remain partially fed in order to be located by the stations of the radio network. Due to this fact, the battery has limited autonomy.

The user of the unit therefore must find a compromise between tedious rechargings at short intervals, and not always necessary or even satisfactory on the electrical level, and the risk of disconnection through loss of energy since his unit had not been recharged for a long period of time.

In order to obtain a measurement of the consumption, and thus to warn the user of a need to recharge, since the current consumed from the battery is very variable, sampling the measurement of a current sensor could be contemplated at a sufficiently high rate in order to recreate its form and then to effect a digital filtering in order to smooth out the signal and obtain this measurement of consumption. However, such a solution would be complex.

SUMMARY OF THE INVENTION

The present invention seeks to measure, in a simpler manner, the current consumed by the circuits of a portable terminal.

To this effect, the invention concerns, first, a device for measurement of the current exchanged between an energy storage source and the electrical circuits of a portable data- or signal-processing terminal, comprising a current measurement sensor intended to be connected between the source and said circuits, characterized by the fact that the sensor is connected to a first input of a first integrating means, arranged so as to integrate the current measurement and to control, as a result, comparison means arranged so as to detect the crossing of a high threshold through the integral of the current and then to apply, to a second input of the first integrating means, a calibrated feedback signal to recall below the high threshold, and second integrating means are provided to integrate the feedback signals in order to provide a measurement of the current exchanged.

Thus, the first integrating means integrate the current and thereby perform a low-pass filtering on it, therefore becoming independent of the instantaneous values that can be assumed. They can have great sensitivity since the feedback limits the dynamics of operation at the high-threshold value. In other words, the comparison means reduce the integral of the current and the two integrating means make a cumulative total of the reductions, which represents the measurement sought, that is to say, the true integral (without feedback) of the current from the start of the measurement.

The invention also concerns a portable data- or signal-processing terminal, characterized by the fact that it includes a device in accordance with the invention.

The invention will be better understood with the aid of the following description of a preferred embodiment of a terminal including the measurement device of the invention, and of a variant, with reference to the attached drawings.

DETAILED DESCRIPTION OF THE INVENTION

Figure 1:
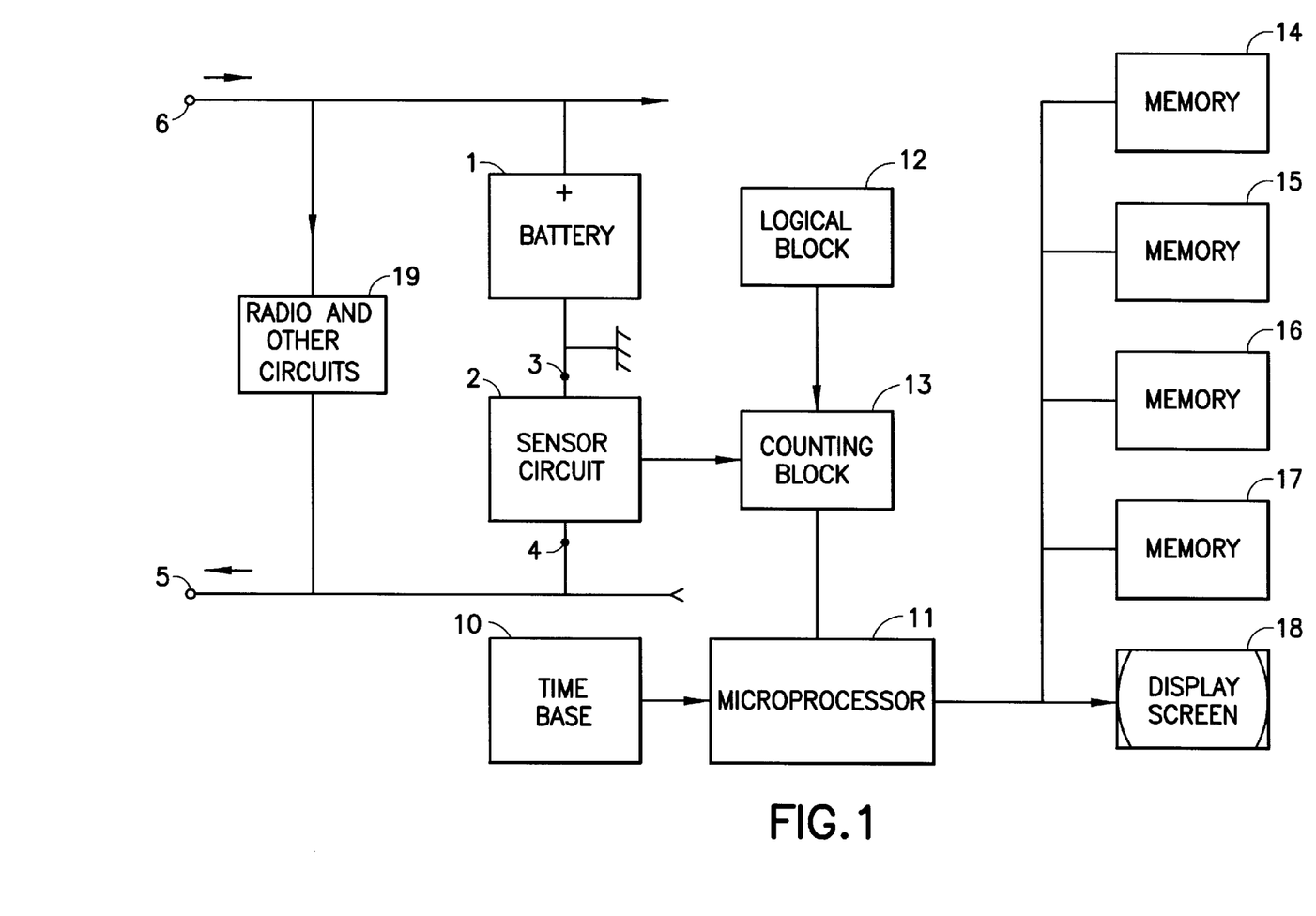
FIG. 1 is an electrical block diagram of a radiotelephone unit including the measurement device, connected to the battery of the unit.

The current measurement device represented in FIG. 1 comprises a sensor circuit 2, placed in series, through terminals 3, 4 between one terminal, here a ground, of a battery 1 and the electrical ground terminals of the various electronic circuits represented. Reference 19 designates the radio and other circuits outside of the device, that is to say, that are involved only by their consumption in order to process digital data or signals, such as, for example, analog vocal signals. Terminal 4 is connected to the above ground terminals, as well as to a terminal 5 of a recharging connector of the battery 1 through an external charger, one terminal 6 of this connector being connected to the positive terminal of the battery 1, which directly supplies the above circuits. By convention, and for the purpose of clarity for the consistency of the description, the negative terminal of the battery 1, connected to the terminal 3, provides the theoretical ground reference. The arrows next to the lines in the area of the above circuits represent the direction of the charging current, when it is present, and the arrows within the lines represent the discharge current.

One will understand that the current measurement device could have been mounted, on the contrary, in series with the positive terminal of the battery 1.

The sensor circuit 2 is connected, by a measurement output, to a digital pulse-counting block 13 controlled by a logical block 12 indicating the status of operation of the unit. The counting block 13 is connected at the output to a memory 14 that stores the result of each counting. In this example, several memories are provided in addition, here three memories 15, 16, 17 in which the results or partial totals of counting are stored, each relating to a particular status of operation of the unit, such as sending, receiving, stand-by, according to the indications of the logical block 12. Memory 14 contains the sum of these partial totals. It can be provided as part of the battery 1. It also can be provided that the shunt 21, the first integrator 22–27 and, for example, the comparison unit 28, 29 are mounted on the battery 1.

A time base 10 controls the rhythm of the functioning of a microprocessor 11 connected to all of the circuits and managing them, in particular sending the current consumption to a display screen 18. More precisely here, knowing the features of the battery 1, the remaining charge is displayed, for example, in the form of a duration of autonomy on stand-by and/or of a duration of activity in communication.

Figure 2:
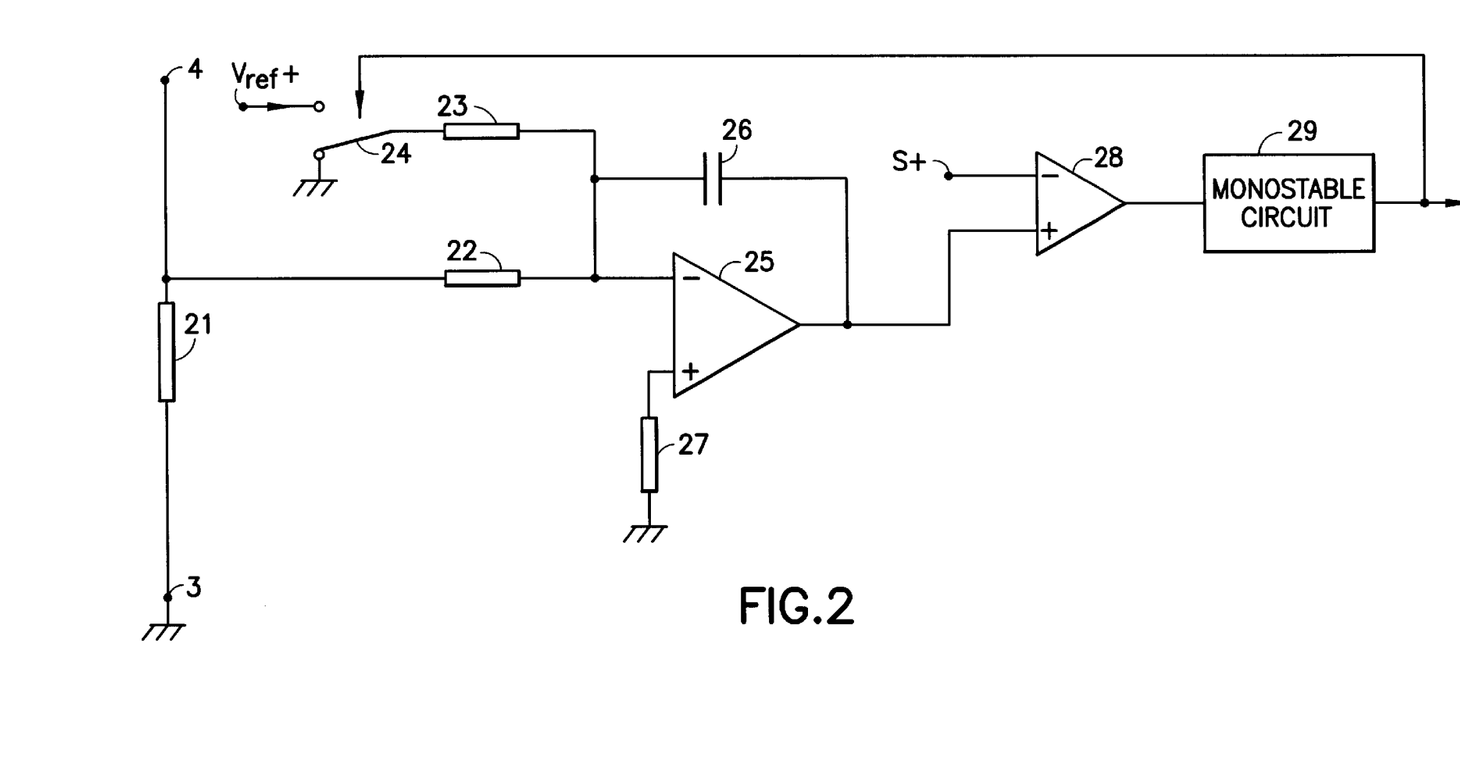
FIG. 2 is a detailed electrical diagram of the preferred embodiment of the device.

The sensor circuit 2 is detailed in FIG. 2. It includes a current collecting element 21, here a current-measuring shunt in the form of a low-value power resistor. The consumption to be measured does not exceed 5 milliamperes here, so that a resistor 21 of 20 ohms produces only a maximum potential drop of 0.1 volt applied to the terminals of the circuits 19, corresponding to a rise in their ground potential, which will fluctuate slightly, which is acceptable.

As indicated, terminal 3 is at the ground (negative terminal of the battery 1) and terminal 4 presents the low potential above representing the current crossing the battery 1. This potential is positive when it concerns a return to the ground of a discharge current and is negative when the battery 1 is charged through the connector 5–6. Terminal 4 is connected to one end of a first input of an integrating assembly made up of a series power resistor 22, of high value with respect to that of resistor 21, connected through its other end to an inverter input of an operational amplifier 25, the other non-inverter input of which is polarized at the ground through a resistor 27. A capacitor 26 connects the output of the amplifier 25 to its inverter input and thus permits an integrating operation, integrating the voltage signal with the terminals of the shunt 21, which represents the current of the battery 1, and in particular allows one to be free of any measurement problem by sampling of the instantaneous current.

The above integrating assembly includes a second input made up of a power resistor 23, one end of which is connected to the inverter input of the amplifier 25, and the other input end of which is fed by a DC reference voltage Vref+through a controlled switch 24. The latter is made up here of an analog gate such as a transistor or equivalent integrated circuit, controlled logically.

The output of unit 22–27, integrating the signal of the terminal 4 representing the discharge current of the battery 1, controls a high threshold comparison circuit 28, 29, controlling a second integrator 12–17.

Generally, the comparator 28, 29 reads the output signal of the first integrator 22–27 and produces in response a feedback signal controlling the switch 24 so as to apply, to the second input 23 of the first integrator 22–27, a calibrated signal tending to bring the output of the latter under the threshold. Since the signal is calibrated, the deviation of voltage at the time of the recall always has a fixed value, corresponding to a variation of electrical charge which is completely determined in the capacitor 26, which, starting from a high threshold voltage Vs+, brings it toward a position of rest, for example two volts. Thus, one limits, within a range compatible with the supply voltage, here between the ground and 12 volts, the dynamics of operation of the output of the integrator 22–27. Otherwise, in the absence of feedback, the output of the integrator 22–27 would increase indefinitely at the time of the battery discharge and this integrator 22–27 would then have to be given reduced sensitivity, in order to present a deviation not exceeding about 10 volts at the time of a complete discharge of the battery 1.

In the present arrangement, on the contrary, one compensates, through feedback, for the variation of the voltage output from the integrator 22–27 and, in order not to lose the corresponding information relating to the integral of the battery current as a function of the time t, the "quantity" of feedback that was applied to the first integrator 22–27 is integrated and then stored.

The comparison circuits 28, 29 and integrators 12–17 will be explained in greater detail.

Figure 3:
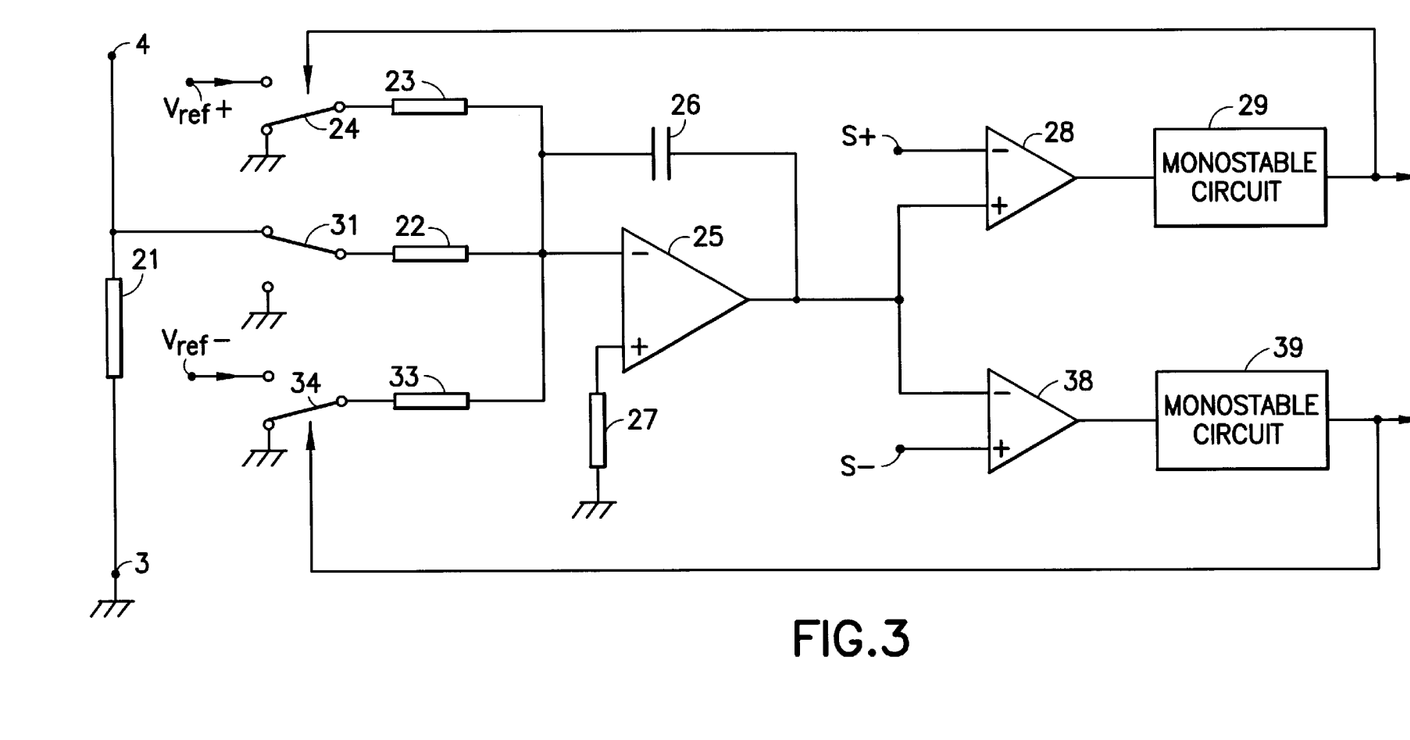
FIG. 3 is a detailed electrical diagram of the embodiment of the variant, repeating the items in FIG. 2, FIG. 4 made up of FIGS. 4A and 4B, is a time diagram illustrating the variations of the measured current and its measurement.
Figure 4A:
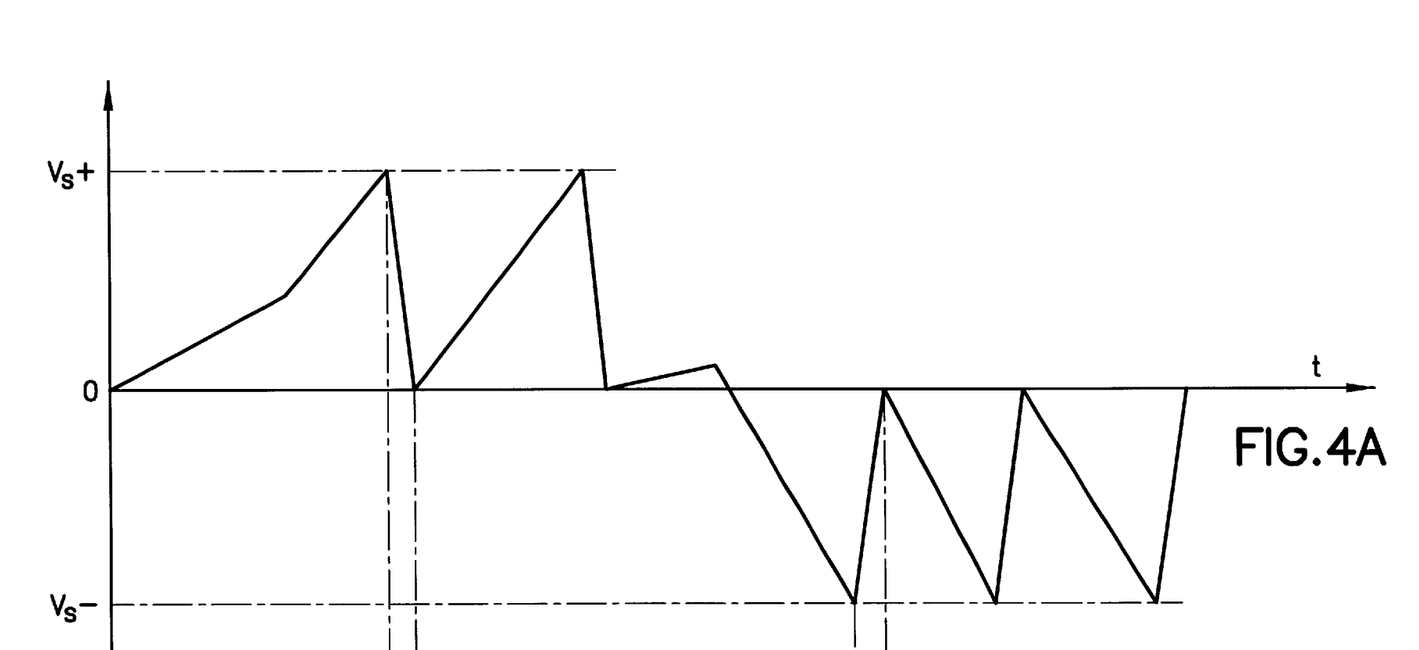
Figure 4B:
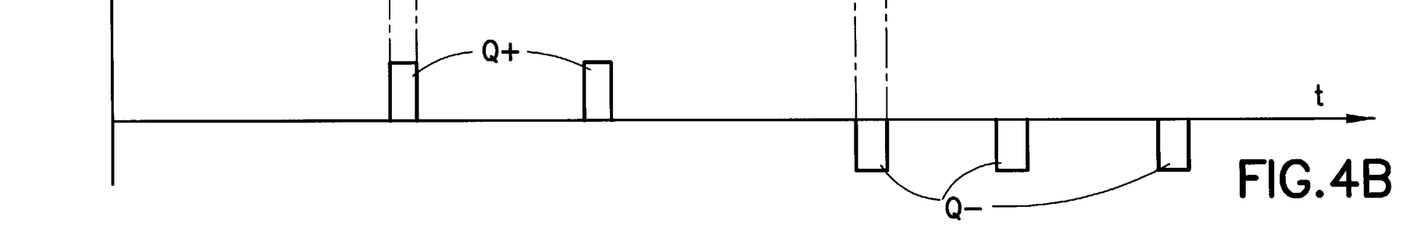

The above feedback, effected in discontinuous manner in this example, consists in feeding back, into the capacitor 26, a predetermined quantity of electrical charge when its output voltage exceeds the high threshold voltage Vs+, here fixed for example at 8 volts (FIG. 4A). FIGS. 4A and 4B, in which the time t is shown on the x-axis, concern the general case of the variant embodiment of FIG. 3 which, in addition to the arrangement of FIG. 2, also concerns so-called negative currents, that is to say those that recharge the battery 1. The only interest here, to begin with, in explaining FIG. 2, is in the discharge current and in the high threshold Vs+.

A comparator 28, consisting of an operational amplifier, receives for this purpose the output of the integration amplifier 25 and compares it to the high threshold voltage Vs+, in order to control a monostable circuit 29 when the output of the integrator amplifier 25 exceeds the threshold Vs+. The monostable circuit 29 then produces a pulse Q+(FIG. 4B) of calibrated duration K, which closes the switch 24 and then causes a transfer, to the capacitor 26, of a quantity of electronic charge which is fixed by the value of the reference voltage Vref+ and the duration K.

The device functions correctly within a very large range of measurement of currents of any form, since the current value measured only influences the rate of change of the output of the integrator 22–27, the latter being, in all cases, limited by the high threshold Vs+.

The monostable 29 can be of analog type, with a filtered and well-stabilized power supply, in order to limit any drift of the duration K. In this example, the monostable 29 is digital and comprises a counter receiving a clock signal from the time base 10 through an AND gate controlled by the comparator 28, the output of which goes to logic state 1 in order to activate the monostable 29.

The reference voltage Vref+is lower than the resting voltage, that is to say, less than 2 volts in this example, if one actually wishes to return to this resting voltage. It can possibly be chosen negative or even simply be the ground voltage. If one wishes to limit the duration K of feedback with respect to the variable cycle of the activations of the monostable 29, one can provide a resistance value 23 lower than that of the resistor 22. One also could provide a higher resting voltage of the integrator 22–27, for example 6 volts, the monostable 29 then being (at threshold voltage Vs+unchanged) triggered more often, in order to inject, each time, into the capacitor 26, a reduced quantity of charge.

One will note that, in order to remain below the threshold Vs+, it is not necessary that the feedback charge correspond exactly to the voltage difference between the resting voltage and the threshold voltage Vs+. This charge can perfectly well be oversized in order to bring the output voltage of the amplifier 25 to a level below the resting voltage, to the extent that this level is compatible with the correct operating range of the arrangement. On the contrary, it can be undersized, that is to say to bring down, possibly on several occasions, the integrated output voltage toward the resting position, but without waiting for it, that is to say, simply bring the integrated voltage under the threshold Vs+. In a similar case, the monostable 28 would be triggered more often.

From this fact, one understands that the cyclically-functioning assembly presented here, with a variable cycle depending on the current measured, is equivalent to a statically-functioning unit in which the measurement variable would no longer be the number of injections of calibrated quantities of charges, but would be the variable amplitude of a permanent controlling signal of an adjustable attenuator replacing switch 24, in order to set the output voltage of the integrator 22–27 to an assigned or resting value.

In addition, one will note that the integrator 22–27 could have been designed to reverse the direction of the integrated current. The above explanations will remain valid, the 0 to 12 volts scale of voltages then to be returned. Likewise, switch 24 associated with the voltage Vs+includes only one high-precision calibrated stage, which improves the precision of the measurement. Otherwise, the output of the monostable 28 could directly supply the resistor 23 through an inverter here providing a descending pulse drawing to the ground, for example.

Each feedback pulse Q+ of the monostable 29 is counted in circuit 13, that is to say added, or integrated in the result of the preceding count in order to provide an updated integral value, here digital, representing the entire feedback since the start of the measurement, that is to say, the number N1 of times that one has lowered, from a predetermined value (Vs+−V rest), the voltage of the amplifier 25. This integral value (N times 4 volts here) of the feedback thus also represents the fictitious value that the actual voltage of the integrator 22–27 would show in addition if it had not undergone feedback. This integral value of the feedback can be stored, preferably as here, in digital form. Memory 14 receives, from the circuit 13, the number N1 of pulses Q+ from the monostable or interval timer 29. In this example, the device in fact provides more detailed information through the fact that, in addition, circuit 12 indicates, to the counting circuit 13, the status of operation of the unit. The counting circuit 13 then allocates the pulse Q+ of the monostable 29 that it has just received to a sub-total of one of the memories 15 to 17, corresponding to a status of operation of the unit. Each time, circuit 13 rereads memory 14 and the memory of memories 15 to 17 which is concerned and adds one unit to the number that it contained. A keypad, not shown, allows the user of the unit to control the central unit 11 in order to consult the memories 14–17 by means of the screen 18.

The central unit 11 divides the number N1 read in memory 14–17 by a fixed number M in read-only memory which represents the maximum possible, that is to say, the integral of the complete discharge current of the battery 1, therefore its capacity in ampere-hours. The quotient N/M obtained is displayed in the form of a discharge percentage or else the microprocessor 11 calculates its 1-complement in order to display a percentage of remaining battery capacity 100 [1−N1/M], displayed as such or even in the form of durations of autonomy remaining for stand-by and/or for communication.

As indicated, the diagram of FIG. 3 repeats the elements of FIG. 2, with the same references and the same functions, and also handles negative input voltages, that is to say also measures the recharging current of the battery 1 through the terminals 5–6. Overall, the functions of the circuits of FIG. 2 are duplicated in order to form two parallel chains of measurement, the measurements of which are subtracted in order to provide a measurement of the balance of consumption. Here, the integrator 22–27 is not duplicated since it is used by both chains, integrating the current in both directions. Logic circuits 12–17 are also shared both chains of measurement.

For this purpose, a second feedback comparison circuit 38, 39 includes a comparator 38 and a monostable circuit 39, corresponding respectively to the circuits 28 and 29, and the description of their operation therefore will not be repeated. The comparator 38 compares the signal issued from the integrating amplifier 25 to a low threshold Vs− to control the closing of a switch 34, corresponding to switch 24, in order to apply a low DC reference voltage Vref− to a third input of the integrating assembly which includes amplifier 25, specifically at one end of a resistor 33 connected, by its other end, to the inverter input of the amplifier 25.

The assembly of FIG. 3 could also function with a single positive power supply, between the ground and 12 volts, for example, the average voltage of 6 volts being chosen as the resting output value of integrating amplifier 25 and the threshold voltages Vs+ and Vs−, like the reference voltages Vref+ and Vref−, preferably having symmetrical values with respect to this average value of 6 volts, in order to provide two dynamic ranges that are as large as possible.

However, it is envisioned here to supply the analog input circuits 25 and if necessary, the monostables 29, 39, with positive 12 volts and negative 12 volts, the logic output signals of which remain in the range of positive voltages.

From this fact, it is the ground that represents the resting voltage, and the threshold voltage Vs− is negative and equal, except for the sign, to Vs+. It is the same for Vref− in comparison to Vref+.

Switches 24 and 34 are then of the rest/work inverter type, with a position of rest polarizing the resistor of the associated input 23, 33 to the ground and thus avoiding the influence of electronic noise.

Furthermore, a change-over switch 31 is provided in series between the resistor 22 and the terminal 4, controlled by the microprocessor 12 in order to effect a calibration of the zero of the measurement device, by grounding of the measurement input 22.

The functioning of the diagram of FIG. 3 is as follows.

As shown in FIG. 4A, the integrating amplifier 25 provides an increasing or decreasing signal representing the integral of the balance of charge of the battery 1, an integral decreased by the effects of the feedbacks already having taken place.

The comparators 28, 38, of which the thresholds Vs+ and Vs− encompass the resting voltage of the integrator/amplifier 25, control, through the respective monostables 29 and 39 and the switches 24, 34, a feedback that pertains to each and brings the output voltage of the amplifier 25 in the range Vs− to Vs+.

The monostable 29 thus controls the circuits 12–17, downstream, belonging to the chain of measurement of the integral N1 of the discharge current, and the monostable 39 likewise controls a chain of measurement of the integral N2 of the charging current of the battery 1, chain formed here of the same circuits 12–17 as the other. The circuit 13 calculates the difference N2−N1 between the total N1 of pulses Q+ of the monostable 29 and the total N2 of the pulses Q− of the monostable 39 generated when the high threshold Vs+, or low threshold Vs−, respectively, is crossed by exiting the range limited by these two thresholds N2−N1, representing the-remaining charge in battery 1.

As indicted, the inverter switch 31, which is equivalent to a controllable short-circuit of input shunt 21, allows the microprocessor 11 to measure the fall-off of any drift due to interference over the course of the time, by counting possible pulses from one of the comparators 28, 38 over a determined period in order to correct, preferably digitally in the circuit 13, the subsequent measurement values.

The application of a calibrated current between the terminals 3, 4 allows the calibration of the sensitivity of the input integrator 22–27 and the feedback circuits (analog part).

Figure 5:
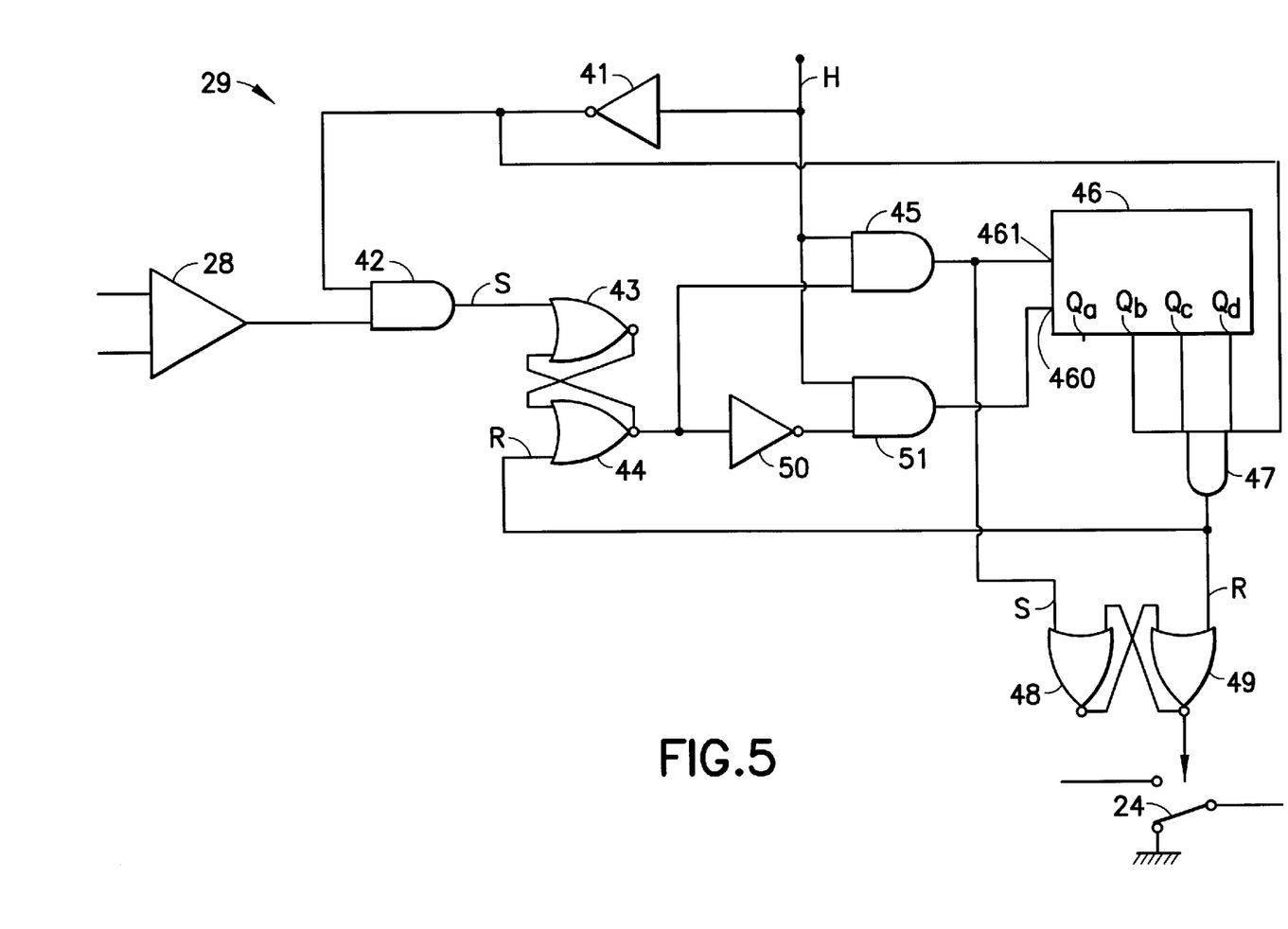
FIG. 5 is a detailed electrical diagram of a calibrated feedback circuit.
Figure 6:
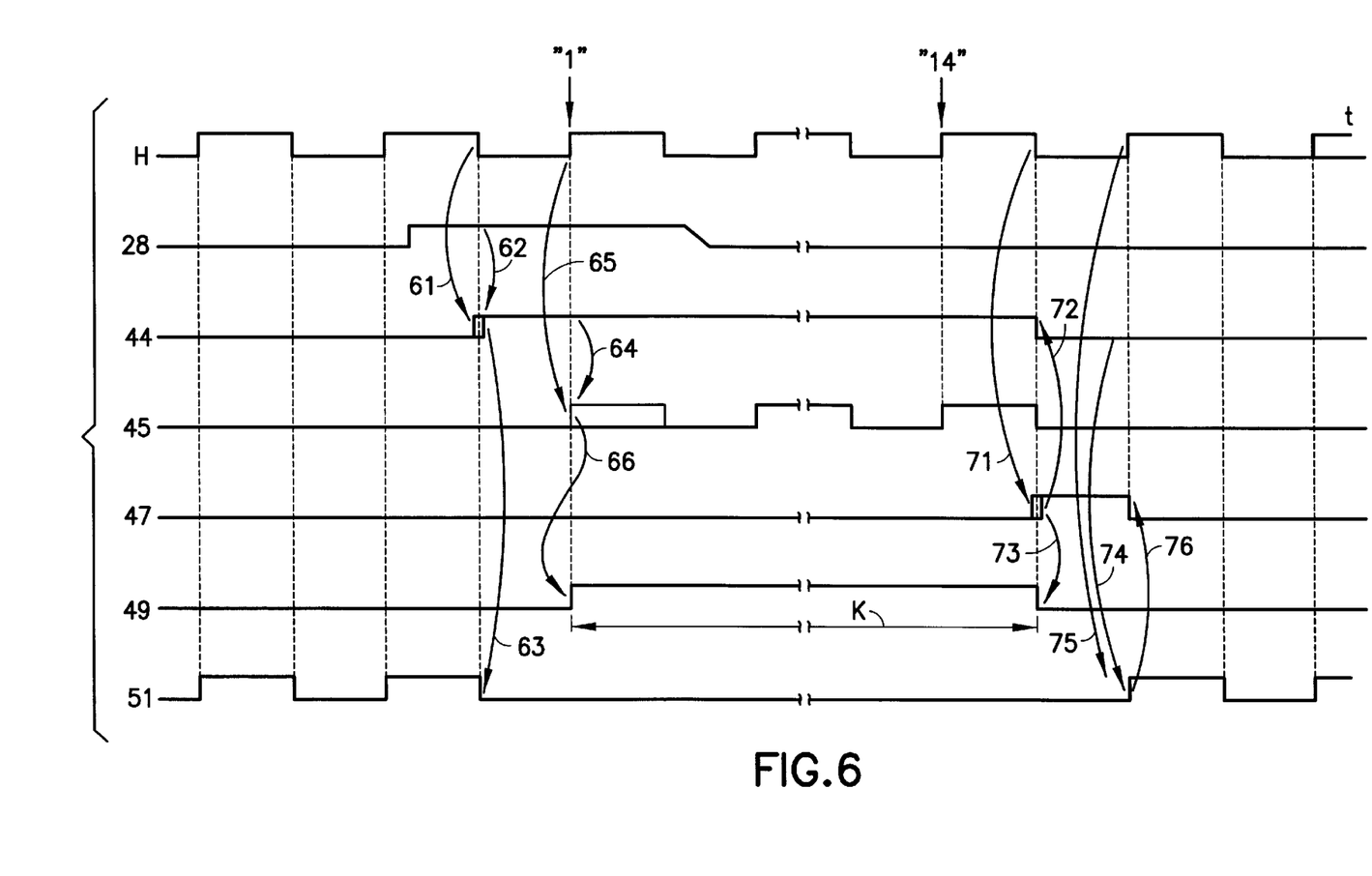
FIG. 6 is a time datagram relating to the feedback circuit of FIG. 5.

FIG. 5 represents in detail the monostable or digital interval timer 29 providing a pulse of calibrated duration K, FIG. 6 representing, as a function of the time t, the status of the outputs of the reference elements.

The digital interval timer 29 comprises a synchronous counter 46 with four levels, the outputs Qa, Qb, Qc Qd of which change in synchronism with a clock H that is controlled from the time base 10 and, more precisely, advance, or are all reset to zero by a special command at the time of the leading edge of the signal from the clock H.

In order to avoid any operational risk that would distort the duration K of the command from switch 24, the counter 46 is surrounded by various logic gates that allow it to be controlled correctly, although the comparator 28 does not have any synchronization with respect to the clock H and, moreover, its output is returned to inactive status before the end of the normal duration K of the control pulse from switch 24.

For this purpose, the output of the comparator 28 is applied to a sampling AND gate 42, controlled by a clock signal H inverted by an inverter 41. The output of gate 42 engages the input S of arming of a gate 43 of an unclocked RS-type flip-flop, consisting of two inverter OR gates 43, 44 looped on each other. The output of the inverter OR circuit gate 44 is applied to the input of an AND gate 45 engaging a clock entry 461 of the counter 46 and receiving the clock signal H on a second input. In this example, one decodes the status "14" (and "15") of the counter 46 by connecting the outputs Qb, Qc, Qd to three inputs of an AND gate 47 with four inputs, which receives the signal from the inverted clock H on the fourth input.

The output of the AND gate 47 is connected to the disarming input R of the inverter OR gate 44 and to the disarming input R of an inverter OR gate of an RS unclocked flip-flop consisting of two inverter OR gates 48, 49 that are mutually looped, and of which the arming input S of gate 48 is connected to the output of AND gate 45.

The output of gate 49 controls switch 24. Moreover, an AND gate 51 receives the clock signal H and applies it to an input 460 for resetting to zero the counter 46, under the control of an inverter gate 50, which connects the output of inverter OR gate 44 to an input of AND gate 51.

The operation of the interval timer 29 is as follows. When the power is turned on, the two RS flip-flops 43, 44 and 48, 49 are forced into resting status through activation in 1 of their input R, for example through a series resistor circuit and a parallel capacitor output from AND gate 47, the capacitor effecting a temporary recall towards the supply voltage that was just established. The comparator 28 being at rest, at output logic state 0, the RS flip-flop 43, 44 maintains its resting position, with an output logic state 0 that closes AND gate 45 to advance counter 46 and open AND gate 51 to reset to zero with each beat of the clock H. AND gate 47 is therefore closed by the output state, all at 0, of counter 46, which is blocked.

If the comparator 28 provides a state 1 of activation of the monostable 29, this state 1 is sampled (arrow 62) by gate 42 during the second semi-period of the signal H at the start of the latter in FIG. 5: arrow 61, if one considers that the active leading edge corresponds to the start of a period. The RS flip-flop 43, 44 then goes to 1 at the output and unlocks (arrow 64) AND gate 45 to advance the counter 46, while locking (arrow 63) AND gate 51 to reset to zero.

Thus, the controls of the counter 46 are preset at any instant but solely in the second semi-period of clock H, although the active leading edge of the following clock period H to set counter 46 to state 1 is taken into account as soon as it arrives, therefore without truncating the first period H of counting, that is to say, without delaying the activation of switch 24. In other words, one fixes the control environment 42 of counter 46 when the latter can be advanced, so that it does not receive simultaneous contradictory orders. Activation of switch 24 is controlled by AND gate 45 of activation of counter 46, the first active leading edge of which activates at 1 (arrow 66) the input S of the flip-flop 48, 49 and transmits this logic state 1 at output 49 and stores it, which activates, by closing, switch 24 in a stable manner, without transmitting the clock thereafter, at the start of counting state 1.

When counter 46 reaches the state "14", the outputs Qb, Qc, Qd are then at 1, the inverted clock H of the AND gate 47 effects an out-of-phase sampling of a semi-period with respect to the clock H, that is to say opens (arrow 71) AND gate 47 during the second semi-period of the clock H, while counter 46 has had time to stabilize itself during the first semi-period. Thus one avoids any decoding of a transient state, that could reset counter 46 to zero early.

The logic state 1 output from AND gate 47 then resets flip-flops 43, 44 and 48, 49 (arrows 72, 73) to zero at the start of the second semi-period of the clock H. Switch 24 is thus closed for exactly 13.5 periods of the clock H.

Gate 51 is unlocked (arrow 74) and allows the clock H (arrow 65) to pass, which resets the counter 46 to zero at the start of the following period. This brings about (arrow 66) the reclosing of gate 47 to reset the flip-flops to zero. The monostable 29 can be triggered again by the comparator 28.

What is claimed is:

1. A device for measurement of current exchanged between an energy supply source and electric circuits of a portable data- or signal- processing terminal, comprising:
   a current-measurement sensor connected between the source and sad circuits;
   a first integrating means with an output and a first input connected to the sensors said first integrating means arranged to integrate the measurement of the current;
   a first comparator means with a first input connected to the output of the first integrating means and an output, said comparator means arranged to detect the crossing of high threshold (Vs+) through the integral of the current;
   a second input of fist integrating means arranged to receive a calibrated feedback signal from the output of said comparator means to recall below the high threshold (Vs+);
   a second integrating means provided to integrate the feedback signal, in order to provide a measurement of the current exchanged;
   a second comparator means to detect the crossing of a low threshold (Vs−) output from the first integrating means and to apply, as a result, to a third input of the first integrating means a calibrated feedback signal to recall above the low threshold (Vs−); and
   a third integrating means to integrate the feedback signals from the second comparator so as to provide a measurement of the current considered, and a subtracting means are provided, at the outputs of the second and third integrating means, for their respective measurements in order to provide a measurement of the balance of consumption.

2. The device according to claim 1, in which the comparator means includes, at the output, a feedback signal calibration means comprising an interval timer arranged to provide a pulse of calibrated duration.

3. The device according to claim 2, in which the calibration means include a switch arranged in order to be controlled by the interval timer and connecting a source of predetermined voltage to the second input of the first integrating means.

4. The device according to claim 1, in which the sensor circuit is connected to a pulse-counting block connected to a memory storing the result of each counting and provided as part of the source.

5. The device according to claim 1 in which the first integrating means functions in a range limited by the two threshold voltages, high Vs+ and low Vs−, and centered on the ground.

6. The device according to claim 2, in which the interval timer is digital and comprises a counter to provide calibrated pulses, controlled by a comparator through a synchronization circuit arranged, in phase opposition with a clock to advance the counter, so as to sample and store an active output state of the comparator.

7. The device according to claim 6, in which the synchronization circuit is provided for sampling the state of the counter, arranged, in phase opposition with the clock, so as to detect a particular state of the counter and then reset the counter and the synchronization circuit to a resting state.

8. A portable data- or signal-processing terminal that comprises the current measurement device of claim 1.

9. The terminal according to claim 8, in which the second integrating means are arranged so as to provide different measurements of current, depending on the state of operation of the terminal.

* * * * *